United States Patent [19]

Reinhardt

[11] Patent Number: 4,617,513

[45] Date of Patent: Oct. 14, 1986

[54] MEASUREMENT DEVICE FOR USE IN HIGH-VOLTAGE GAS-INSULATED SWITCH GEAR

[75] Inventor: Hans-Jüergen Reinhardt, Berlin, Fed. Rep. of Germany

[73] Assignee: Siemens Aktiengesellschaft, Munich and Berlin, Fed. Rep. of Germany

[21] Appl. No.: 633,829

[22] Filed: Jul. 24, 1984

[30] Foreign Application Priority Data

Jul. 29, 1983 [DE] Fed. Rep. of Germany ....... 3327917

[51] Int. Cl.$^4$ .......................... H01H 9/50; H01G 1/00
[52] U.S. Cl. ...................................... 324/126; 361/306
[58] Field of Search .................. 324/126, 72; 361/301, 361/302, 303, 306, 308, 326, 328, 330; 323/364

[56] References Cited

U.S. PATENT DOCUMENTS 2,613,345 10/1952 Osterland ............................ 323/364
3,939,412 2/1976 Hermstein et al. .................... 324/96

Primary Examiner—Reinhard J. Eisenzopf
Assistant Examiner—Stephen M. Baker
Attorney, Agent, or Firm—F. W. Powers; J. L. James

[57] ABSTRACT

Partial discharges are to be detected within a metal-encapsulated, compressed-gas-insulated high-voltage switchgear using a capacitive voltage divider. The measurement device used for this purpose contains an electrode which is dish-shaped and is inserted flush in an opening of the capsule. A measurement cable leading to the display or measurement unit is built up coaxially and connected with a terminal element which is a supporting component and contains the electrode and the edge of the opening in the capsule. In addition, the terminal includes an outer connecting element in the shape of a hollow cone which extends to the edge of the opening and an inner connecting element in the shape of a cone that extends to the electrode, which are coaxially arranged, the ratio of whose diameters $d_a/d_i$ is constant, and which have the characteristic impedance of the measuring cable.

8 Claims, 3 Drawing Figures

MEASUREMENT DEVICE FOR USE IN HIGH-VOLTAGE GAS-INSULATED SWITCH GEAR

BACKGROUND OF THE INVENTION

The invention concerns a measurement device for the determination of partial discharges within metal-encapsulated, compressed-gas-insulated high-voltage switchgear with a capacitive voltage divider, whose high-voltage capacitor is formed by an inner conductor mounted with insulation in a metal capsule and an electrode mounted with insulation in an opening in the capsule, and whose low-voltage capacitor is formed by the electrode and the edge of the opening in the capsule and which is connected by means of a measuring cable with a display and/or measurement device.

A measurement device of this kind is known from U.S. Pat. No. 3,939,412. In this device the insulator that supports the inner conductor is brought out through an opening in the metal capsule and the electrode is mounted on the outer shell of the insulator or within the vicinity of the opening in the capsule, coaxially with the inner conductor. As a display or measurement device for the detection of corona discharges, for which this measurement device is used, spray discharge detectors or oscillographs are employed, which are connected to the electrode and the ground connection of the metal capsule. Since the corona discharges to be measured are relatively powerful, the fact that the capacitance of the high voltage capacitor $C_H$ is relatively small compared with that of the low-voltage capacitor $C_N$ poses no problems for the measurement.

The purpose of the invention is to measure localized partial discharges inside a gas insulated metalclad switchgear by means of a capacitive voltage divider, where the tapping of the partial discharge pulses is to have a high upper cutoff frequency in the megahertz range, with a high division ratio $C_H/(C_H+C_N)$, since the rise time of these pulses is very small and it is nevertheless desired to obtain an accurate reproduction of the pulses.

SUMMARY OF THE INVENTION

To accomplish this task according to the invention, the electrode is dish-shaped and inserted flush in the opening of the capsule. The measuring cable is a coaxial cable and is connected to a terminal element, which, as a supporting component with a fastening flange, forms the connection to the capsule and contains the electrode and the edge of the opening in the capsule. The terminal element contains an external connecting element in the shape of a hollow cone, which extends the edge of the opening in the capsule. The terminal element also contains an internal connecting element in the shape of a cone, which extends to the electrode. Both cones are coaxially arranged, and ratio of their diameters $d_a/d_i$ is constant, so that the elements have the characteristic impedance of the measuring cable.

This design of a terminal element as a supporting component which bears the dish-shaped electrode that is mounted flush with the inner wall of the capsule permits on the one hand the maintenance of the dimensions of the capsule, without any impairment of the dielectric strength being caused as a result of the measurement device and, on the other, a particuarly simple method of installation. In addition, as a result of the cone-shaped design of the connecting elements that lead to the parts forming the low-voltage capacitor, namely the electrode and the edge of the openings of the capsule and which have the characteristic impedance of the coaxial measuring cable, the measurement device is made to behave as if the coaxial measuring cable were extended directly to the electrode which forms a plate of each of the capacitors. As a result, within the device there are no reflections or interference-producing overlappings of the pulses of the partial discharges to be measured. Furthermore, the capacitance of the low-voltage capacitor can be kept relatively small in comparison to the capacitance of the high-voltage capacitor, by appropriate selection of the dimensions of the dish-shaped electrode and the gap surrounding it at the edge of the opening in the capsule. This improves the division ration of the voltage divider. The diameter of the dish-shaped electrode can be selected in such a manner that the desired high cut-off frequency is achieved. There is therefore no significant distortion of the pulse reproduction.

For further ease in manufacturing, it is preferable to design the terminal element to be fastened to a flange of the capsule that is spatially separated from the edge of the opening in the capsule, and for at least two conducting connections be provided between the outer connecting element and the flange of the capsule, which connections are arranged in the axial direction of the inner conductor and lie flush in the inner wall of the capsule. By this means a direct, large surface conducting connection is formed with the electrode of the low-voltge capacitor which is formed by means of the edge of the opening in the capsule and the spatially separated flange of the capsule. This permits an accurate potential transfer from the terminal element to the grounded capsule. For the conducting connection it is desirable to use flexible strips of conducting material, particularly copper. This will prevent any distortion of the caught pulses of the partial discharges.

For the dish-shaped electrode, it is advantageous to use a cut-out of the capsule coaxially surrounding the inner conductor. Since this capsule is ordinarily designed as a coaxial cylinder, and the connection openings that are usually introduced in the capsule are circular, a circular cut-out is also recommended for the electrode. For simpler manufacturing and assembly, the electrode may be designed as a flat plate and mounted flush, tangentially to the deepest point of the cut-out.

The edge of the electrode and the edge of the opening in the capsule that is opposed to it can be extended outward like flanges, so that the division ratio of the voltage divider can be set arbitrarily.

BRIEF DESCRIPTION OF THE DRAWINGS

Exemplary and non-limiting preferred embodiments of the invention are shown in the drawings, in which.

DETAILED DESCRIPTION OF THE PREFERRED EMBODIMENTS

Figure 1:
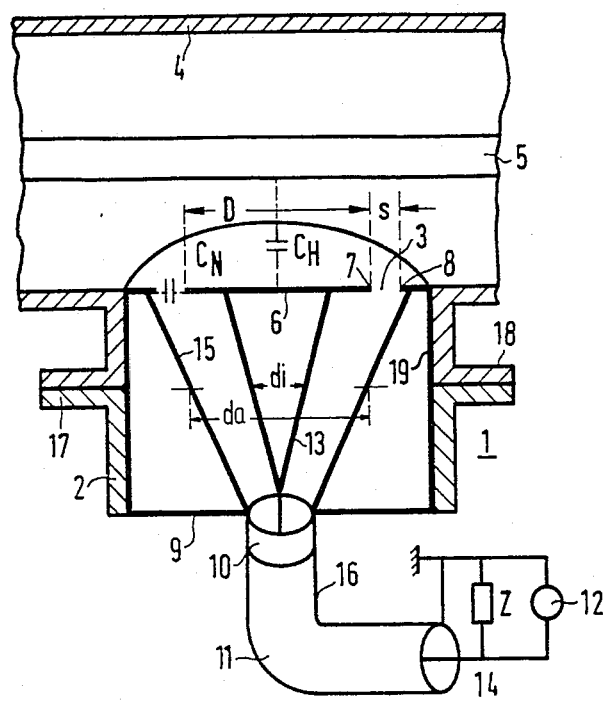
FIG. 1 shows a schematic cross-sectional view of a preferred embodiment of the invention.

One object of the invention is to measure the voltage pulses occurring as the result of localized partial discharges in a metal-encapsulated switchgear which is insulated with compressed gas, particularly $SF_6$. For this purpose a measurement device 1 designed in accordance with the invention is used. The device 1 is mounted in an opening 3 in the metal capsule 4 with the aid of a terminal element 2 in form of a housing. The metal capsule 4 is cylindrical and coaxially surrounds a bare high-voltage inner conductor 5; correspondingly, the opening 3 in the capsule 4 is circular.

In order to pick up the voltage pulses that occur as the result of localized partial discharges, a capacitive voltage divider is used. This divider consists of a high-voltage capacitor $C_H$ and a low-voltage capacitor $C_N$. The high-voltage capacitor $C_H$ is formed by the conductor 5 and a dish-shaped electrode 6, which coaxially surrounds the conductor 5 and is inserted flush in the opening 3 of the capsule 4. The low-voltage capacitor $C_N$ is formed by the edge 7 of the electrode 6 and the edge 8 of the opening 3 of the grounded capsule 4, which is spaced from and opposed to the edge 7. The capacitance of the low-voltage capacitor $C_N$ can be established arbitrarily by appropriately adjusting the spacing s between the edges 7 and 8 and the diameter D of the electrode 6. The electrode 6 is dimensioned in such a way that the low-voltage capacitor $C_N$ has a low value so that the ratio $C_H/(C_H+C_N)$ is relatively high.

The electrode 6 and the edge 8 of the opening 3 of the capsule 4 are structurally consolidated in the terminal element 2 and form its inner flat front surface. The terminal element 2 is designed as a self-supporting component. On the external front surface 9 of the terminal element 2 is mounted a coaxial cable socket 10. This permits a connection to the coaxial measuring cable 11, which leads to a measuring or display unit 12. Between the socket 10 and the electrode 6 is a conical inner connecting element 13, which connects the inner conductor 14 of the measuring cable 11 with the electrode 6. The outer connecting element 15 is coaxial with the connecting element 13; it is hollow and conical and constitutes the connection between the grounded outer conductor 16 of the measuring cable 11 and the edge 8 of the capsule 4. The ratio of each diameter $d_a$ of the outer connecting element 15 and the corresponding diameter $d_i$ of the inner connecting element 13 is constant and selected in such a way that the connecting elements 13 and 15 have the same impedance Z as the measuring cable 11. This eliminates reflections at the connection between the coaxial measurement cable 11 and the low-voltage capacitor $C_N$.

In order to save weight, the two connecting elements 13 and 15 are preferably hollow cones. The terminal element 2 of the measurement device 1 is also provided with a fastening flange 17, which is opposed to a flange 18 of the capsule 4. The two flanges 17 and 18 form a pressure tight connection. The outer wall 19 of the terminal element 2 projects beyond the fastening flange 17, extends to the edge 8 of the opening 3, and is tightly pressed against the capsule 4, so that a perfect potential transfer is ensured from the edge 8 to the capsule 4.

Figure 2:
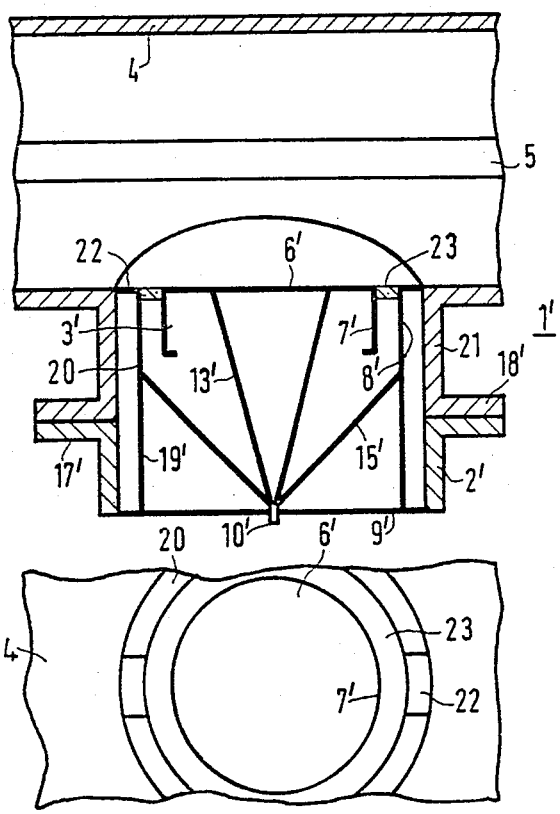
FIG. 2 shows a schematic cross-sectional view of a second preferred embodiment of the invention.
Figure 3:
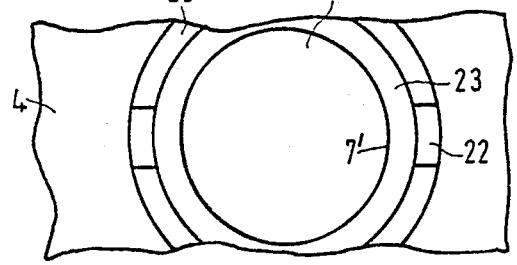
FIG. 3 is a schematic representation of a second preferred embodiment as viewed from inside to the wall of the capsule.

Reference will now be had to FIGS. 2 and 3. The correspondence between similar parts is indicated by primes on the reference numerals.

In this case, the outer wall 19' of the terminal element 2' leads to the edge 8' of the capsule 4 and is spatially separated from the fastening flange 17'. As a result, there is a gap 20 between the wall 21 leading to the flange 18' of the capsule 4 and the outer wall 19'. In order to ensure a good grounding of both elements, and to avoid a distortion in the measurement results, a large-surface conductive connection is established on the inner wall of the capsule 4 in the axial direction of the conductor 5, by means of a flexible copper strip 22. It is also possible to form a conducting bridge over the entire circular gap 20 on the inner wall of the capsule 4.

In this embodiment, in order to brace the terminal element 2', a ring 23 of insulating material is also provided between the edge 7' of the electrode 6' and the edge 8'. In addition, the edge 7' of the electrode 6' is extended outward in the shape of a flange, in order to permit a different distribution ratio to be set. The low-voltage capacitor $C_N$ is then formed by this flange-shaped edge 7' and the upper part of the outer wall 19', which lies opposite and forms the edge 8'.

The pickup of the voltage pulses produced by the partial discharges can be further improved by connecting a coil, in particular a toroidal coil, in a familiar manner, in parallel with the low-voltage capacitor $C_N$. This further suppresses the normal frequency component of the operating voltage, even more than it is already, the result of the lower cut-off frequency of the measurement device, which is computed from the characteristic impedance Z and the capacitance of the low-voltage capacitor $C_N$ as $$(1/2\pi \cdot Z \cdot C_N).$$

If the measurement device is inserted at several points within a gas-insulated high-voltage switchgear, then it is also possible to approximately localize the causes for the partial discharge, on the basis of the differences in the transit times of the partial discharge pulses that are measured.

Those skilled in the art will understand that changes can be made in the preferred embodiments here described, and that these embodiments can be used for other purposes. Such changes and uses are within the scope of the invention, which is limited only by the claims which follow.

What is claimed is:

1. A measurement device for use in high-voltage, compressed gas-insulated switchgear, the device being of a type in which a capacitive voltage divider is formed by a high-voltage capacitor and a low-voltage capacitor, the high voltage capacitor being formed by an inner conductor mounted with insulation in a metal capsule filled with compressed gas and an electrode mounted with insulation in an opening in the capsule and the low-voltage capacitor being formed by said electrode and an edge of said opening, the device being connectable with display/measurement apparatus by a coaxial measuring cable with a characteristic impedance, the device comprising:

a dish-shaped electrode located flush in said opening;

a terminal element having a fastening flange by which it is attached to the capsule and containing the electrode and said edge, the terminal element being a supporting component and further comprising a hollow conical outer connecting element extending to said edge and an inner conical connecting element extending to the electrode, said connecting elements being coaxial and having a constant ratio $d_a/d_i$ where $d_a$ is a diameter of the outer connecting element and $d_i$ is a corresponding diameter of the inner connecting element, whereby said connecting elements have said characteristic impedance of the coaxial measuring cable.

2. The device of claim 1, wherein said fastening flange is securable to a mating flange on the capsule, said mating flange being spaced from said edge, and wherein the terminal element further comprises a least two axially oriented conducting connections extending between the outer terminal element and said mating flange flush with said opening.

3. The device of claim 1, wherein the capsule is cylindrical and coaxial with the conductor and the electrode is shaped as a cut-out portion of the capsule.

4. The device of claim 1, wherein the electrode has a circular periphery.

5. The device of claim 1, wherein the inner and outer connecting elements are coaxially mounted hollow cones.

6. The device of claim 1, wherein the terminal element further comprises a coaxial cable socket for said measuring cable.

7. The device of claim 1, wherein said edge of the opening in the capsule has a flanged extension and the electrode has a corresponding flanged extension at its periphery.

8. The device of claim 2, wherein each of said conducting connections between the outer connecting element and capsule is a flexible strip.

* * * * *